United States Patent
Fenk

(10) Patent No.: US 7,183,841 B2
(45) Date of Patent: Feb. 27, 2007

(54) POWER AMPLIFIER ARRANGEMENT, AND A METHOD FOR AMPLIFICATION OF A SIGNAL

(75) Inventor: Josef Fenk, Eching/Ottenburg (DE)

(73) Assignee: Infineon Technologies AG, Munich (DE)

(*) Notice: Subject to any disclaimer, the term of this patent is extended or adjusted under 35 U.S.C. 154(b) by 83 days.

(21) Appl. No.: 11/029,099

(22) Filed: Jan. 4, 2005

(65) Prior Publication Data
US 2005/0179499 A1    Aug. 18, 2005

Related U.S. Application Data

(60) Provisional application No. 60/534,212, filed on Jan. 5, 2004.

(30) Foreign Application Priority Data
Jan. 5, 2004    (DE)    .................. 10 2004 001 094

(51) Int. Cl.
*H03F 1/14* (2006.01)
(52) U.S. Cl. .................. 330/51; 330/285; 330/297
(58) Field of Classification Search .............. 330/295, 330/124 R, 285, 297
See application file for complete search history.

(56) References Cited

U.S. PATENT DOCUMENTS 4,598,252 A    7/1986   Andricos 5,256,987 A *  10/1993  Kibayashi et al. .......... 330/295

FOREIGN PATENT DOCUMENTS

EP    0 945 977 A2    9/1999

OTHER PUBLICATIONS

"Polar Loop™ Radio Subsystem for GSM™, GPRS, and EDGE Mobile Handset Applications", Skyworks Solutions, Inc., Jul. 18, 2003, 2 pgs.
"Single Inductor, Tiny Buck-Boost Converter Provides 95% Efficiency in Lithium-Ion to 3.3V Applications—Design Note 275", Mark Jordan, Linear Technology Design Notes; dn275f LT/TP 0102 371.5K; Linear Technology Corporation, 2002, 2 pgs.
U.S. Appl. No. 11/029,853, filed Jan. 5, 2005, Josef Fenk.

* cited by examiner

*Primary Examiner*—Robert Pascal
*Assistant Examiner*—Hieu Nguyen
(74) *Attorney, Agent, or Firm*—Eschweiler & Associates, LLC

(57) ABSTRACT

A power amplifier arrangement is disclosed which has two or more amplifiers connected in parallel. The amplifiers can be switched on and off independently of one another by means of control devices. At least one DC/DC converter is provided for supplying voltage to the amplifiers. A significant improvement in the efficiency of a power amplifier is achieved by the combination of the voltage supplied by means of a DC/DC converter for the amplifiers with distributed power gain. The arrangement is therefore particularly suitable for use in mobile radio transmission arrangements.

21 Claims, 3 Drawing Sheets

POWER AMPLIFIER ARRANGEMENT, AND A METHOD FOR AMPLIFICATION OF A SIGNAL

REFERENCE TO RELATED APPLICATION

This application claims the benefit of the priority date of German application DE 102004001094.3, filed on Jan. 5, 2004 and U.S. Provisional application 60/534,212 filed Jan. 5, 2004, the contents of which are herein incorporated by reference in their entirety.

FIELD OF THE INVENTION

The present invention relates to a power amplifier arrangement, to the use of the power amplifier arrangement in a radio transmission arrangement, to a mobile radio, and to a method for amplification of a signal.

BACKGROUND OF THE INVENTION

Radio-frequency power amplifiers are normally used both in mobile terminals and in base stations for mobile radios. Particularly in the case of mobile radio units, it is desirable to keep the power consumption of the entire arrangement as low as possible in order to increase the life of the rechargeable battery, and thus the time for which the radio can be used for speech and on standby. The power consumption of a radio transmitter is governed mainly by the power consumption of the power amplifier.

Modern rechargeable batteries which are suitable for use in mobile radios are designed, for example, using lithium-ion technology, or the like. Batteries such as these have the disadvantage that they have a relatively wide voltage range, which extends from 4.5 V when the rechargeable battery is fully charged, down to 3V when the rechargeable battery is discharged. Future generations of lithium batteries with an even greater storage capacity per unit volume are predicted to have an even wider voltage range from 2 V to 5 V.

Owing to the trend towards mobile radios which cope with ever more applications at the same time, an increasing bandwidth and an ever greater data rate, their power consumption is also increasing.

The relatively wide voltage range in which the electrical charge store emits its energy leads, however, to the radio-frequency power amplifier in particular, the so-called RF-PA, which is normally connected directly to the rechargeable battery, having a widely fluctuating supply voltage. The fluctuating supply voltage leads inter alia to problems with power matching. The output impedance of the amplifier must be matched to the impedance of the antenna. Even now, the output impedance fluctuates from about 2.53 Ω at 4.5 V to 1.13 Ω at 3 V, depending on the supply voltage. If the voltage range with which the power amplifier is supplied becomes even wider in the future, then the output impedance will fluctuate from about 3.13 Ω at 5 V to 0.5 Ω at 2 V. This results in a factor of 6.25 between the maximum and minimum output impedance that occurs. However, this will have an adverse effect on the efficiency of the power amplifier over the entire rechargeable battery voltage range.

The reason why the radio-frequency power amplifier is normally connected directly to the rechargeable battery is to avoid any additional voltage drop resulting from series regulators and to avoid the efficiency losses caused by voltage converters. The article by: M. Jordan: Single Inductor, Tiny Buck-Boost Converter Provides 95% Efficiency in Lithium-Ion to 3.3 V Applications—Design Note 275, Linear Technology Corporation, California, USA 2002 describes a power supply for a WCDMA (Wideband Code Division Multiple Access) mobile radio and its power amplifier.

The power matching of the power amplifier to a transmission antenna is normally optimized at the required transmission arrangement rated power. The efficiency at the rated power is accordingly comparatively high, but decreases relatively sharply towards lower transmission power levels.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

the present invention is directed to a power amplifier arrangement that is suitable for use as a radio-frequency power amplifier in mobile radios and has high efficiency over the entire transmission power range, irrespective of the battery voltage. The invention is further directed to a method for amplification of a signal, which method has high efficiency over the entire transmission power range, irrespective of the battery voltage.

According to one embodiment of the invention, the power amplifier arrangement comprises an input and an output, and a first signal path, which couples the input to the output and contains a first amplifier. The amplifier arrangement further comprises a second signal path, which couples the input to the output and contains a second-amplifier, and a control device coupled to the first signal path and to the second signal path. The control device is configured to activate and deactivate the first and second amplifiers as a function of a desired gain for the power amplifier arrangement. The arrangement also includes at least one DC/DC converter coupled to the first and second amplifier in order to supply them with voltage.

With regard to another embodiment of the invention, a method of amplifying a signal comprises activating at least one of two or more amplifiers which are connected between an input and an output of a power amplifier arrangement, as a function of a desired gain for the signal, and supplying the supply voltage for the two or more amplifiers via at least one DC/DC converter, with the DC/DC converter emitting an output voltage independently of an input voltage.

According to the present invention, the overall gain is on the one hand split between two or more amplifiers which are connected in parallel and, on the other hand, these amplifiers are supplied by means of at least one DC/DC converter. The splitting of the overall gain between two or more amplifiers which are connected in parallel combined with them being supplied by means of a DC/DC converter has the advantage that the efficiency of the power amplifier is considerably improved, particularly when a transmission is made using less than the rated power. Furthermore, the efficiency is not dependent on the magnitude of the supply voltage. Depending on the output power that is required, one or more of the amplifiers may be switched on and off. This results in a further reduction in the power consumption. The amplifiers in the power amplifier arrangement are fed with the required operating voltage by means of one or more DC/DC converters.

The at least one DC/DC converter is preferably designed such that a variable voltage is produced at its output, as a function of the selected output power.

The DC/DC converter accordingly produces a high output voltage when a high output power is required, and emits a relatively low voltage when a low output power is required. For example, the DC/DC converter produces a supply voltage for the amplifiers of 4.5 V when the output power is 2 W, and produces a supply voltage of only 2 V when the output power is 5 mW. This makes it possible to further improve the overall efficiency over the entire power range.

Furthermore, this results in the advantage that the DC/DC converter produces at its output a supply voltage which is not dependent on the voltage being produced at that time by a rechargeable battery which is connected to an input of the DC/DC converter. The efficiency of the power amplifier arrangement is accordingly independent of the state of charge of the rechargeable battery.

Each amplifier in the power amplifier arrangement, in one example, has in each case at least one associated means for impedance matching, which couples the respective amplifier to the output of the power amplifier arrangement.

The means for impedance matching advantageously makes it possible to optimize the efficiency of each of the individual amplifiers which are connected in parallel.

The amplifiers, in one example, are connected in parallel in the described manner by means of radio-frequency transformers. This makes it possible to reduce the losses even further.

The radio-frequency transformers, for example, may be provided on the input side of the amplifiers with the inputs of the individual amplifiers being coupled to the input of the power amplifier arrangement.

It is likewise advantageous, alternatively or additionally, to provide one or more further converters in the form of transformers, which couples or couple the outputs of the amplifiers to the output of the power amplifier arrangement.

Instead of a converter in the form of a transformer, any LC network or other means for impedance matching may also be provided in accordance with the present invention.

Each amplifier, in one example, has one associated DC/DC converter. The amplifiers can thus be operated with a different supply voltage. The DC/DC converter may be designed not only to supply the supply voltage for the amplifier but also, additionally or alternatively, to provide a bias supply. Alternatively, only one DC/DC converter may also be provided, with two or more series switches. The series switches may, for example, be in the form of MOS, metal-oxide semiconductor field-effect transistors.

The at least one DC/DC converter advantageously results in a higher voltage being produced at its output than its input voltage. Higher operating voltages make it possible to produce a power amplifier arrangement with an even wider bandwidth. This is advantageous, particularly bearing in mind the increasing number of frequency bands to be processed for multiband and multi-standard appliances.

The converters in the form of transformers each advantageously have one connection which is connected to the control device and via which the respective radio-frequency transformer and an amplifier connected thereto can be activated and deactivated.

The converter or converters in the form of a transformer or transformers for supplying voltage to at least one of the two or more amplifiers which are connected in parallel may, in one example, have a control input which is connected to the control device. Each amplifier can be activated and deactivated by switching the respective supply voltage on and off.

Alternatively or additionally, in each case one connection for supplying a bias signal for the respectively associated amplifier is advantageously provided on the converters which are in the form of transformers. The bias connection is connected to the control device. This advantageously makes it possible, for example, to set the operating point of the respective amplifier, and/or for this to be determined by the control device.

The power amplifier arrangement may advantageously be designed using balanced circuitry. In this case, the individual amplifiers may in each case be duplicated for each branch of the balance branches in the circuit. One pair of mutually associated amplifiers may in each case advantageously be coupled to a common converter, which is in the form of a transformer, at the input and/or the output of the power amplifier.

The parallel-connected amplifiers in the power amplifier arrangement, in one example, each have at least one field-effect transistor for the actual signal amplification. This advantageously allows the entire power amplifier arrangement to be produced using a metal oxide semiconductor, MOS production method.

Alternatively, at least one bipolar transistor may also in each case be provided for signal amplification in the amplifiers in the power amplifier arrangement. The power amplifier arrangement can thus be produced using bipolar circuitry, for example, based on gallium arsenide, GaAs.

The at least one transistor for the amplifiers in the power amplifier arrangement may in each case have one associated cascode transistor in order to form a respective cascode stage. This advantageously improves the backward isolation. Furthermore, the amplifier stability is improved, particularly in the case of multistage amplifier arrangements.

The described power amplifier arrangement can preferably be used in a radio transmission arrangement. For this purpose, it is preferable for a transmission antenna to be coupled to the output of the power amplifier arrangement.

In particular, the described power amplifier arrangement can advantageously be used for amplification of radio-frequency signals in base stations or mobile appliances for mobile radio.

The amplifiers may in each case be designed for the same signal gain. The amplifiers may also be designed in binary steps. Furthermore, the steps may be configured, for example, in such a way that four of the parallel-connected amplifiers each produce an output power of 500 mW while two others are each designed for the power range up to 100 mW. An additional amplifier is preferably designed for the power range from 3–30 mW, corresponding to 5–15 dBmW.

Some or all of the amplifiers in the power amplifier arrangement may have individual or common driver stages. These driver stages may be coupled to the input of the power amplifier arrangement via further transformer couplings and, furthermore, may be connected to the inputs of the two or more amplifiers via transformer couplings. That amplifier stage which is designed for the lowest power range may advantageously couple directly the input to the output of the power amplifier arrangement, via in each case one converter in the form of a transformer, as a bypass amplifier stage, bypassing the driver stages. This makes it possible to reduce the power loss even further, since all of the other amplifier stages, including the driver stages in the lowest amplifier range, can be deactivated.

The driver stage may advantageously be coupled to the control device in order to activate and deactivate it.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail in the following text using a number of exemplary embodiments and with reference to the drawings, in which.

DETAILED DESCRIPTION OF THE INVENTION

Figure 1:
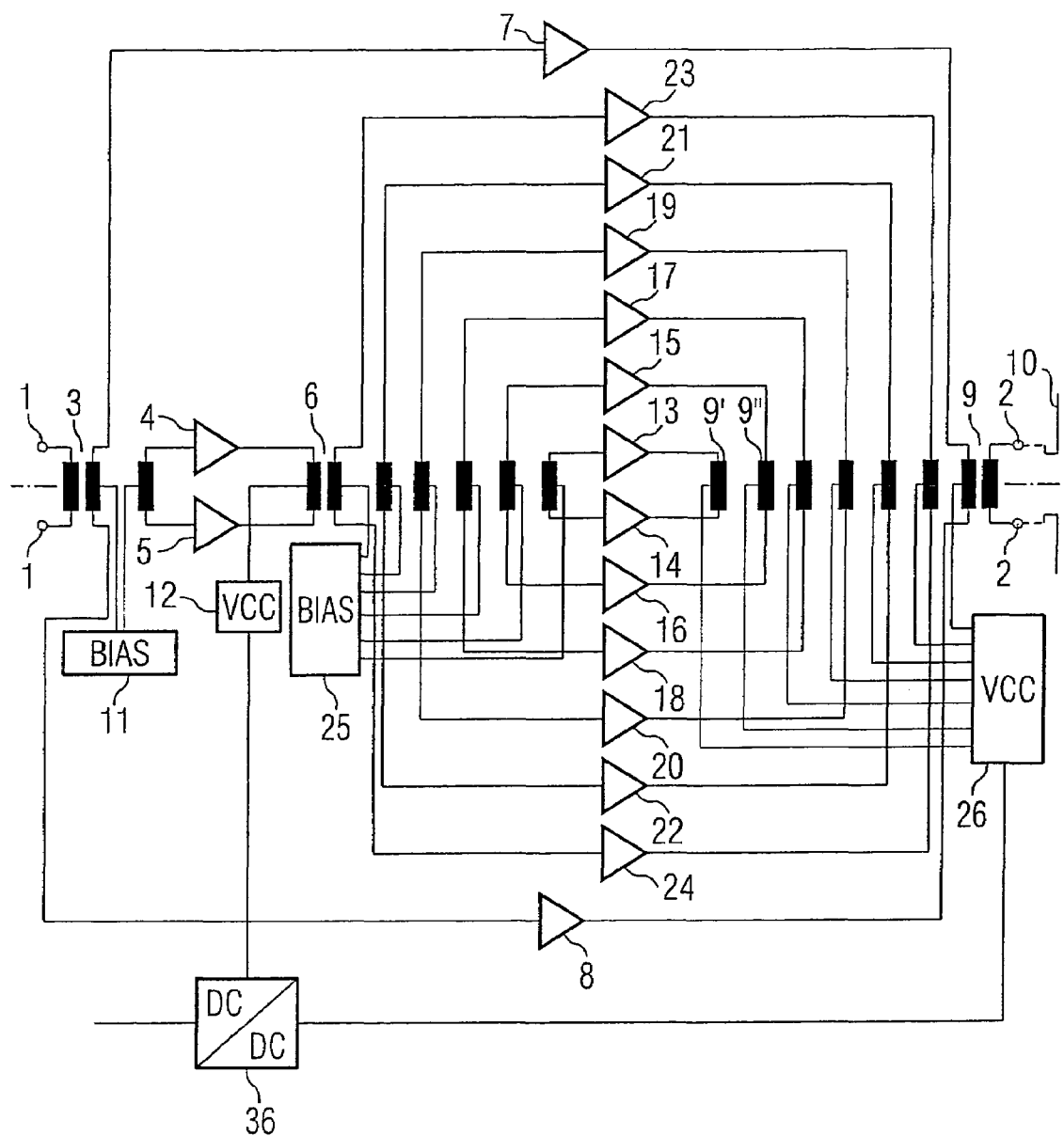
FIG. 1 shows a first exemplary embodiment of a power amplifier arrangement in the form of a circuit diagram according to the present invention.

FIG. 1 shows a power amplifier arrangement having an input 1 and an output 2. The primary of a radio-frequency transformer 3 is connected to the input 1, which is balanced and is designed to carry difference signals. The secondary of the transformer 3 is connected to one input stage 4, 5 to the primary of a further radio-frequency transformer 6. The secondary of the transformer 3 is also connected via one bypass amplifier 7, 8 to a primary of yet another radio-frequency transformer 9. The secondary of the radio-frequency transformer 9 forms the output 2 of the amplifier arrangement, and is coupled to an antenna 10.

A center tap on the secondary winding of the third transformer 3 is in each case connected to a control block 11, which is formed by a control device 11, 12, 25, 26. A center tap on the primary of the transformer 6 is connected to a control block 12. The radio-frequency transformer 6 has a total of six secondary windings, which each have two connections which are connected to one input of an amplifier pair. The six amplifier pairs in each case have two amplifiers 13, 14; 15, 16; 17, 18; 19, 20; 21, 22; 23, 24. On the output side, each amplifier pair 13, 14; 15, 16; 17, 18; 19, 20; 21, 22; 23, 24 is connected to one connection of a primary winding, each of which forms a primary winding of the transformer 9. All the secondary windings of the transformer 6 and primary windings of the transformer 9 which are connected to the inputs and outputs of the amplifiers 13 to 24 each have a center trap. Those windings of the transformer 6 which form its secondary windings are each connected via a center tap to a control block 25. Center taps on the primary windings of the transformer 9 are connected to a control block 26. The control blocks 11, 12, 25, 26 jointly form the control device 11, 12, 25, 26 for driving the power amplifier arrangement.

The control block 11 is designed to supply a bias voltage, which can in each case be switched on and off, for the bypass amplifiers 7, 8 as well as for the input stages 4, 5. The control block 25 is designed to supply a bias voltage, which can in each case be switched on and off, for the amplifiers 13 to 24.

The control block 12 is designed to supply a supply voltage for the amplifiers in the input stage 4, 5. The control block 26 is designed to supply a supply voltage to each of the amplifiers 13 to 24. The control blocks 12, 26, which are used for supplying voltage to the amplifiers and input stages, are connected on the input side to the input of a DC/DC converter 36, in order to supply them with their own voltage.

In each case in pairs, and respectively in conjunction with the input stage 4, 5, the amplifiers 13 to 20 have a maximum output power of 500 mW. If all of the stages 13 to 20 are activated, then a maximum output power of 2 W is accordingly possible. The amplifiers 21, 22 as well as 23, 24 are designed in pairs, in conjunction with the input stage, for a power of 100 mW each.

The bypass amplifiers 7, 8 are provided in a power range from 3 mW to 30 mW.

When the power range up to 30 mW is activated, specifically by activation of the amplifiers 7, 8, provision is made for the other amplifiers 4, 5 as well as 13 to 24 to be switched off completely, so that the input signal for the low power range is amplified exclusively by the amplifiers 7, 8. The bypass arrangement thus avoids the creation of unnecessary power losses in the stages 13 to 24 as well as the input stages 4, 5 during operation at a low output power.

The radio-frequency transformers 3, 6, 9 allow improved power and impedance matching in the respectively required power range, in particular to the antenna 10.

The primary windings of the transformer 9 are designed for the impedances of the respectively connected amplifiers 7, 8, 13 to 24. The four windings that form the primary of the transformer 9 and which are associated with the amplifiers 13 to 20 are thus designed for the impedance of these 0.5 W steps. The windings which are connected to the amplifiers 21 to 24 are designed for the impedance of the 100 mW steps. That winding of the transformer 9 which is connected to the amplifiers 7, 8 is designed for the output power of this stage, from 3 to 30 mW. This therefore always results in good power matching, with high efficiency, at all of the operating points.

The supply voltage at the output of the DC/DC converter 36 is not dependent on voltage fluctuations at its input.

The output operating voltage for the amplifiers 13 to 24 as well as 7, 8 is produced via the primary windings of the transformer 9 with the DC/DC converter 36 and the control block 26, and is fed from a common supply voltage or from separate supply voltages. The input-side-supply to the amplifier output stages 13 to 24 is provided via the control block 25. The control block 25 in this case switches the respective required stages on or off, and also ensures the required, dynamic bias operating point. By analogy with this, the input stages 4, 5 as well as the bypass amplifiers 7, 8 are activated and deactivated by the control block 11, which also defines their operating point. The amplifiers 4, 5 receive their operating voltage via the DC/DC converter 36 and the control block 12.

Since, according to the present invention, the rated power is not produced in a concentrated output stage but by the amplifiers 13 to 24 connected in parallel and their linking by means of a radio-frequency transformer 6 on the input side of the output stage and a further radio-frequency transformer 9 on the output side to the output stage, the arrangement results in the efficiency being improved over the entire output power range that can be selected. This results in a considerable reduction in the power consumption of the power amplifier over the entire power range. Particularly in the region of 250 mW, in which most transmission time is spent, the efficiency of the present invention is improved by a factor of approximately 3. This makes it possible to considerably lengthen the speech time when using the circuit as a power amplifier in a mobile radio transmitter, and to improve the standby time in the same way. For the same desired standby and speech time, the battery may be considerably smaller, which in turns means a significant weight and cost saving.

The use of the DC/DC converter 36 to supply the voltage for the amplifiers makes the efficiency of the arrangement independent of the input voltage, which may fluctuate as a function of the state of charge of the source feeding it. An additional advantage is that the DC/DC converter 36 emits an output voltage as a function of the desired transmission power.

The amplifiers 4, 5 could also be designed to have two or more stages. The amplifiers 4, 5 could be designed to have parallel-connected stages, analogously to the output stages 13 to 24, in the input stage. Furthermore, alternatively, a greater or lesser number of amplifiers 13 to 24 could be connected in parallel in the output stage.

Figure 2:
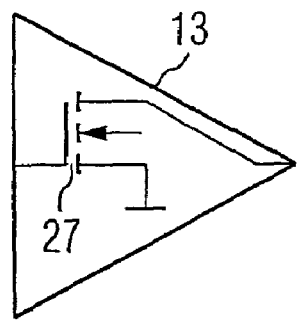
FIG. 2 shows a first exemplary embodiment of an amplifier for use in FIG. 1.

FIG. 2 shows one exemplary embodiment of the amplifiers 4, 5, 13 to 24 from FIG. 1. In this case, the amplifiers 4, 5, and 13 to 24 each have a metal oxide semiconductor, MOS transistor 27. The gate connection of the MOS transistor 27 forms the input of the amplifier which, by way of example, is provided with the reference symbol 13. The controlled path through the unipolar field-effect transistor 27 is connected between the output of the amplifier 13 and the reference ground potential. The transistor 27 in FIG. 2 is preferably based on LDMOS circuitry.

Figure 3:
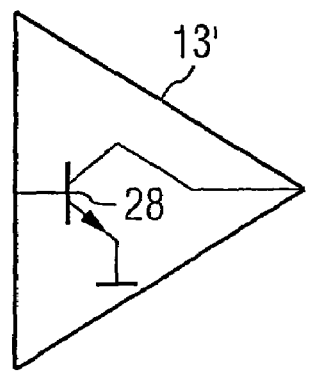
FIG. 3 shows a second exemplary embodiment of an amplifier for use in FIG. 1.

Alternatively, the amplifiers 4, 5, and 13 to 24 may be in the form of amplifiers 13' with a bipolar transistor 28, as shown in FIG. 3. In this case, the base connection of the transistor 28 is the input of the amplifier 13'. The collector connection is connected to the output of the transistor 13'. The emitter connection is connected to the reference ground potential.

The illustrated embodiment based on bipolar circuitry preferably uses a silicon production method or gallium arsenide technology.

Figure 4:
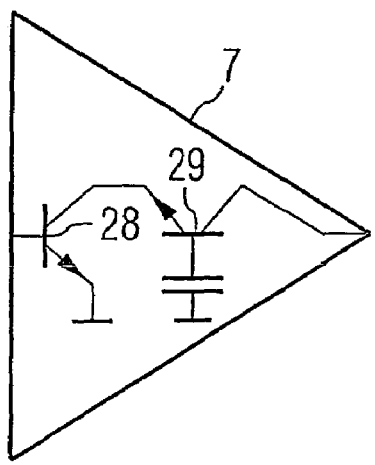
FIG. 4 shows a third exemplary embodiment of an amplifier for use in FIG. 1.

FIG. 4 shows an exemplary embodiment for the bypass amplifiers 7, 8. A cascode stage 29 is additionally connected downstream from the transistor stage with the bipolar transistor 28. The emitter connection of the cascode transistor 29 is connected to the collector connection of the amplifier transistor 28, and its collector collection is connected to the output. The base connection of the cascode transistor 29 is connected via a capacitance to the reference ground potential. The cascode stage 29 considerably improves the backward isolation for the bypass amplifiers 7, 8. Furthermore, the stability of the amplifier arrangement is improved, particularly during operation of the input stages 4, 5 with one or more of the output amplifiers 13 to 24, that is to say with two or more series-connected amplifier stages.

Figure 5:
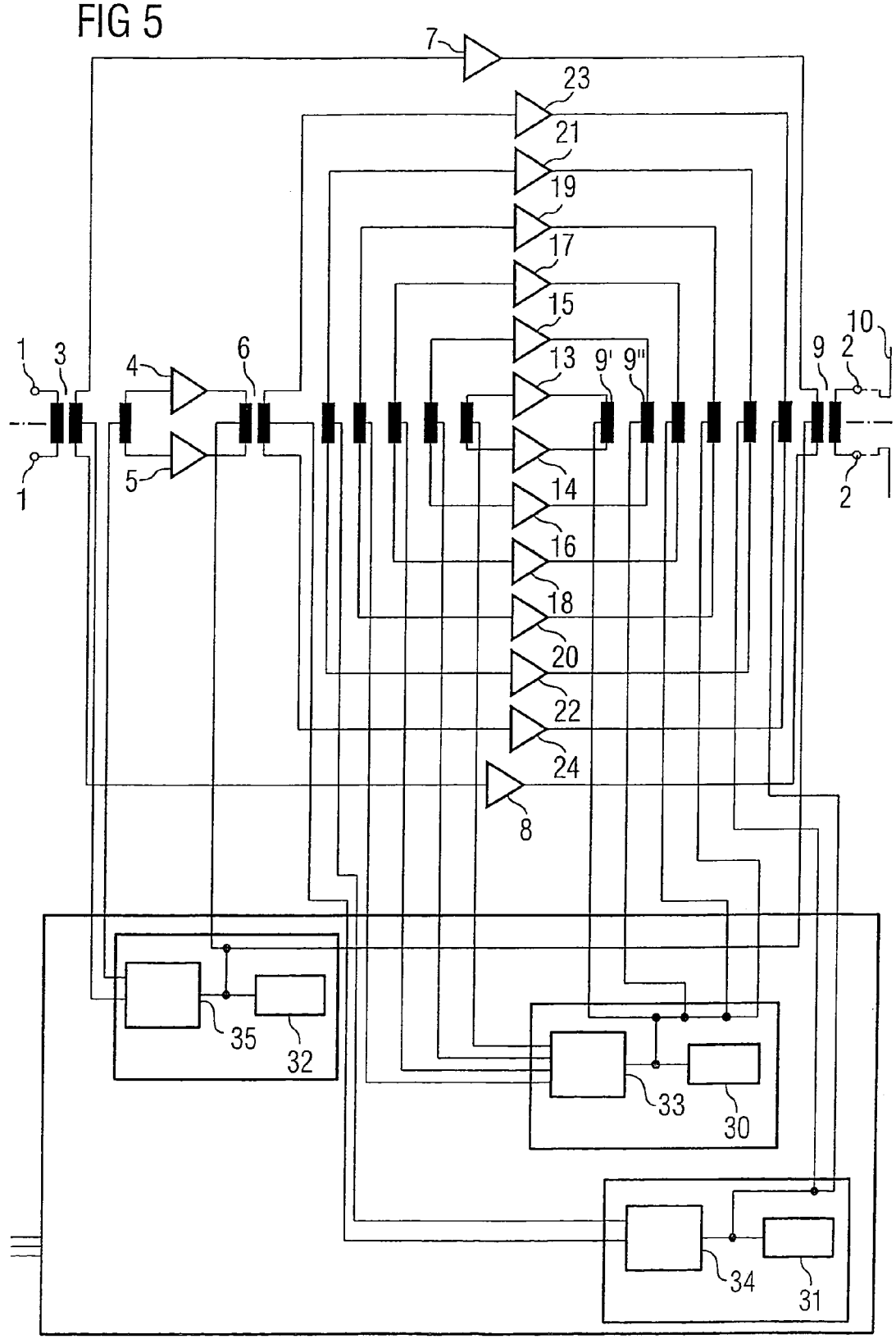
FIG. 5 shows a second exemplary embodiment of a power amplifier arrangement in the form of a circuit diagram according to the present invention.

FIG. 5 shows a development of the circuit shown in FIG. 1. The components used in the circuit shown in FIG. 5, their connections to one another and the advantageous method of operation largely correspond to those in FIG. 1. However, the DC/DC converters 30, 31, 32 which are used in FIG. 5 instead of the DC/DC converter 36 are designed and connected to the amplifiers such that amplifiers with approximately the same power are in each case combined and are driven by a common DC/DC converter 30, 31, 32. Thus, in the case of the circuit shown in FIG. 5, the four parallel-connected amplifier stages which each produce 500 mW and have the reference symbols 13, 14; 15, 16; 17, 18; 19, 20 are supplied from a common DC/DC converter 30.

A further DC/DC converter 31 drives the 100 mW stages 21, 22; 23, 24. The bypass amplifiers 7, 8 are driven and supplied by yet another DC/DC converter 32. The DC/DC converters 30, 31, 32 are connected to the respectively associated amplifiers via the radio-frequency transformers 6, 9 and center taps in each case, as explained above with reference to the control blocks 12, 26 for FIG. 1. Each DC/DC converter 30, 31, 32 has an associated control block 33, 34, 35, which is designed to set the bias and, in addition, to switch the respective amplifiers on and off. For this purpose, the control block 33 is coupled via respective secondary windings of the transformer 6 to the input connections of the amplifiers 13, 14, 15, 16, 17, 18, 19, 20. The control block 34 is coupled via secondary windings of the transformer 6 to inputs of the amplifiers 21, 22, 23, 24. The control block 35 is coupled via secondary windings of the transformer 3 to inputs of the input stages 4, 5 and of the bypass amplifiers 7, 8.

The DC/DC converters 30, 31, 32 are likewise connected to the control blocks 33, 34, 35 which are respectively associated with them.

Since all of the amplifiers 4, 5, 7, 8, 13 to 24 as well as the DC/DC converters 30, 31, 32 are each used only over a restricted dynamic range, this results in the highest possible overall efficiencies. All of the bias control blocks 33, 34, 35 could also be combined to form a so-called power controller in a so-called power control unit.

As an alternative to the illustrated exemplary embodiments in FIGS. 1 and 5, all of the control blocks for the bias supply 33 to 35 and the power amplifiers 4, 5, 7, 8, 13 to 24 could also be produced by means of a combined CMOS and LDMOS manufacturing process, within the scope of the invention. In this case, it would be advantageous to design all of the power components of the DC/DC converter and of the radio-frequency power amplifiers for a voltage of, for example, 12 V, while all of the small signal assemblies and low power assemblies are designed using a CMOS process with a lower supply voltage of, for example, 3 V or less.

This combination allows the production of particularly high-speed DC/DC converters with switching frequencies up to the clock range of the GSM clock of 13–26 MHz and, furthermore, the provision of radio-frequency power amplifiers with particularly high efficiency.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A power amplifier arrangement, comprising:
   an input and an output;
   a first signal path, which couples the input to the output, the first path comprising a first amplifier;
   a second signal path, which couples the input to the output, the second path comprising a second amplifier;
   a control device coupled to the first signal path and to the second signal path, and configured to selectively activate and deactivate the first and second amplifiers as a function of a desired gain of the power amplifier arrangement; and
   at least one DC/DC converter coupled to the first and second amplifiers, and configured to supply the first and second amplifiers with a voltage, wherein the DC/DC converter is further configured to produce a variable supply voltage at its output that is substantially independent of an input voltage applied thereto and which is a function of the desired non-zero gain.

2. The power amplifier arrangement of claim 1, further comprising:
   a first means for impedance matching in the first signal path, and operable to couple the first amplifier to the input or to the output; and
   a second means for impedance matching in the second signal path, and operable to couple the second amplifier to the input or to the output.

3. The power amplifier arrangement of claim 2, wherein the first means for impedance matching and the second means for impedance matching each comprise at least one inductance or capacitance.

4. The power amplifier arrangement of claim 1, wherein the at least one DC/DC converter comprises:
   a first DC/DC converter coupled to the first amplifier and configured to supply a voltage thereto; and
   a second DC/DC converter coupled to the second amplifier and configured to supply a voltage thereto.

5. The power amplifier arrangement of claim 1, wherein the at least one DC/DC converter comprises two outputs, one of which is coupled to the first amplifier and the other of which is coupled to the second amplifier, and wherein the at least one DC/DC converter is configured to supply the first and second amplifiers with differing voltages.

6. The power amplifier arrangement of claim 1, wherein the at least one DC/DC converter is configured to produce a higher voltage at its output than the voltage at its input.

7. The power amplifier arrangement of claim 1, further comprising a transformer converter configured to couple the first and second amplifiers to the input or to the output of the power amplifier arrangement, or to both.

8. The power amplifier arrangement of claim 1, further comprising:
   an input transformer converter configured to couple the first and second amplifiers to the input of the power amplifier arrangement; and
   an output transformer converter configured to couple the first and second amplifiers to the output of the power amplifier arrangement.

9. The power amplifier arrangement of claim 7, wherein the transformer converter comprises a control input connected to the control device, and wherein the transformer converter is configured, based on a status of the control input, to switch the first or second amplifier, or both, on and off.

10. The power amplifier arrangement of claim 7, wherein the transformer converter comprises a control input connected to the control device, and wherein the transformer converter is configured, based on a status of the control input, to supply a voltage to the first or second amplifier, or both.

11. The power amplifier arrangement of claim 7, wherein the transformer converter comprises a bias connection connected to the control device, and wherein the transformer converter is configured to supply a bias signal for the first or second amplifier based on a state of the bias connection.

12. The power amplifier arrangement of claim 1, wherein the power amplifier arrangement is designed using balanced circuitry, wherein the first amplifier comprises two first sub-amplifiers coupled together in parallel and the second amplifier comprises two second sub-amplifiers coupled together in parallel.

13. The power amplifier arrangement of claim 1, wherein the first and the second amplifier each comprise at least one field-effect transistor for signal amplification.

14. The power amplifier arrangement of claim 1, wherein the first and the second amplifier each comprise at least one bipolar transistor for signal amplification.

15. The power amplifier arrangement of claim 1, wherein the first and the second amplifier each comprise at least one transistor for signal amplification, with an associated cascode stage coupled thereto.

16. The power amplifier arrangement of claim 1, wherein the first and second amplifiers form a first amplifier stage, and further comprising a second amplifier stage coupled in series with the first amplifier stage.

17. The power amplifier arrangement of claim 16, further comprising a bypass signal path comprising a third amplifier stage connected between the input and the output.

18. A method for amplifying a signal comprising:
   activating at least one of two or more amplifiers that are connected between an input and an output of a power amplifier arrangement, as a function of a desired gain for the signal;
   supplying a supply voltage for the two or more amplifiers via at least one DC/DC converter, wherein the DC/DC converter emits an output voltage that is substantially independent of an input voltage supplied thereto and which is a function of the desired non-zero pain of the power amplifier arrangement.

19. The method of claim 18, wherein the DC/DC converter emits an output voltage which is greater than the input voltage supplied thereto.

20. The method of claim 19, wherein the at least one DC/DC converter emits the output voltage as a function of the desired signal gain.

21. The method of claim 18, wherein the at least one DC/DC converter produces two or more different output voltages and supplies them to the two or more amplifiers.

* * * * *

UNITED STATES PATENT AND TRADEMARK OFFICE
CERTIFICATE OF CORRECTION

PATENT NO. : 7,183,841 B2 Page 1 of 1
APPLICATION NO. : 11/029099
DATED : February 27, 2007
INVENTOR(S) : Josef Fenk It is certified that error appears in the above-identified patent and that said Letters Patent is hereby corrected as shown below:

Column 10, line 52: Please replace the word "pain" with the word --gain--.

Signed and Sealed this

Twenty-first Day of August, 2007

JON W. DUDAS
*Director of the United States Patent and Trademark Office*